United States Patent [19]
Fazio et al.

[11] Patent Number: 5,245,570
[45] Date of Patent: Sep. 14, 1993

[54] FLOATING GATE NON-VOLATILE MEMORY BLOCKS AND SELECT TRANSISTORS

[75] Inventors: Albert Fazio, Los Gatos; Gregory E. Atwood, San Jose; Neal R. Mielke, Los Altos Hills; Alan E. Baker, Fair Oaks, all of Calif.

[73] Assignee: Intel Corporation, Santa Clara, Calif.

[21] Appl. No.: 632,959

[22] Filed: Dec. 21, 1990

[51] Int. Cl.$^5$ .............................................. G11C 8/00
[52] U.S. Cl. ............................... 365/185; 365/230.03
[58] Field of Search ............. 365/185, 230.03, 230.06, 365/189.01, 189.02, 230.01

[56] References Cited
U.S. PATENT DOCUMENTS

| | | | |
|---|---|---|---|
| 4,849,943 | 7/1989 | Pfennings | 365/230.06 |
| 4,939,696 | 7/1990 | Katsuo et al. | 365/230.03 |
| 4,958,326 | 9/1990 | Sakurai | 365/230.03 |
| 4,961,164 | 10/1990 | Miyaoka et al. | 365/230.03 |
| 4,967,399 | 10/1990 | Kuwabara et al. | 365/230.06 |
| 4,977,538 | 12/1990 | Anami et al. | 365/230.03 |
| 5,065,364 | 11/1991 | Atwood et al. | 365/185 |

*Primary Examiner*—Eugene R. LaRoche
*Assistant Examiner*—Tan Nguyen
*Attorney, Agent, or Firm*—Blakely, Sokoloff, Taylor & Zafman

[57] ABSTRACT

A non-volatile memory device is described. The memory device includes a global bit line, a first block, and a second block. The first block includes a first memory cell having a drain region, a source region, a floating gate and a control gate. A first word line is coupled to the control gate of the first memory cell. A first local bit line is coupled to the drain region of the first memory cell. A first selecting means couples the first local bit line to the global bit line. The second block includes a second memory cell having a drain region, a source region, a floating gate and a control gate. A second word line is coupled to the control gate of the second memory cell. A second local bit line is coupled to the drain region of the second memory cell. A second selecting means couples the second local bit line to the global bit line.

10 Claims, 4 Drawing Sheets

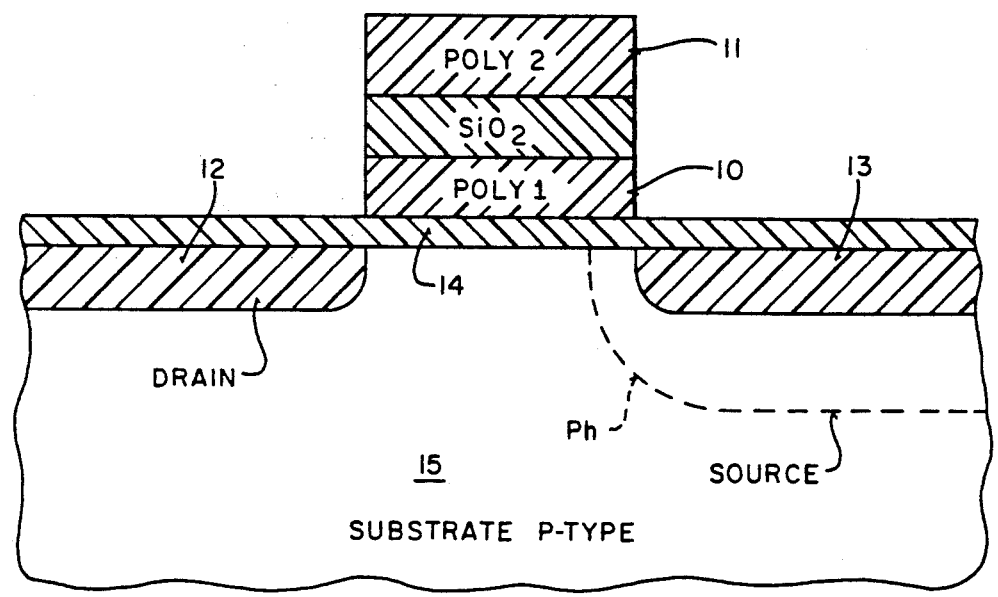
FIG_1 (PRIOR ART)

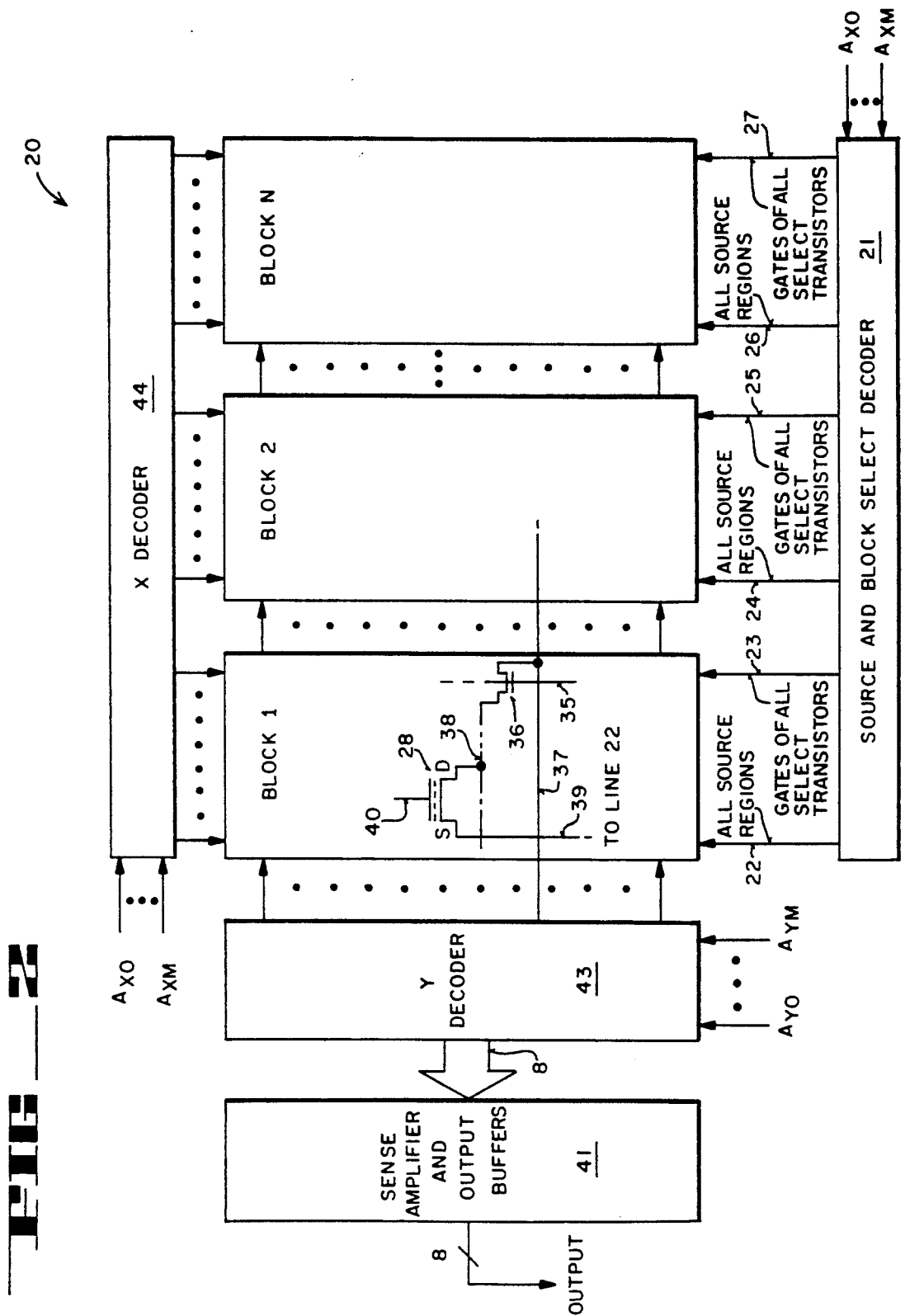
FIG._2

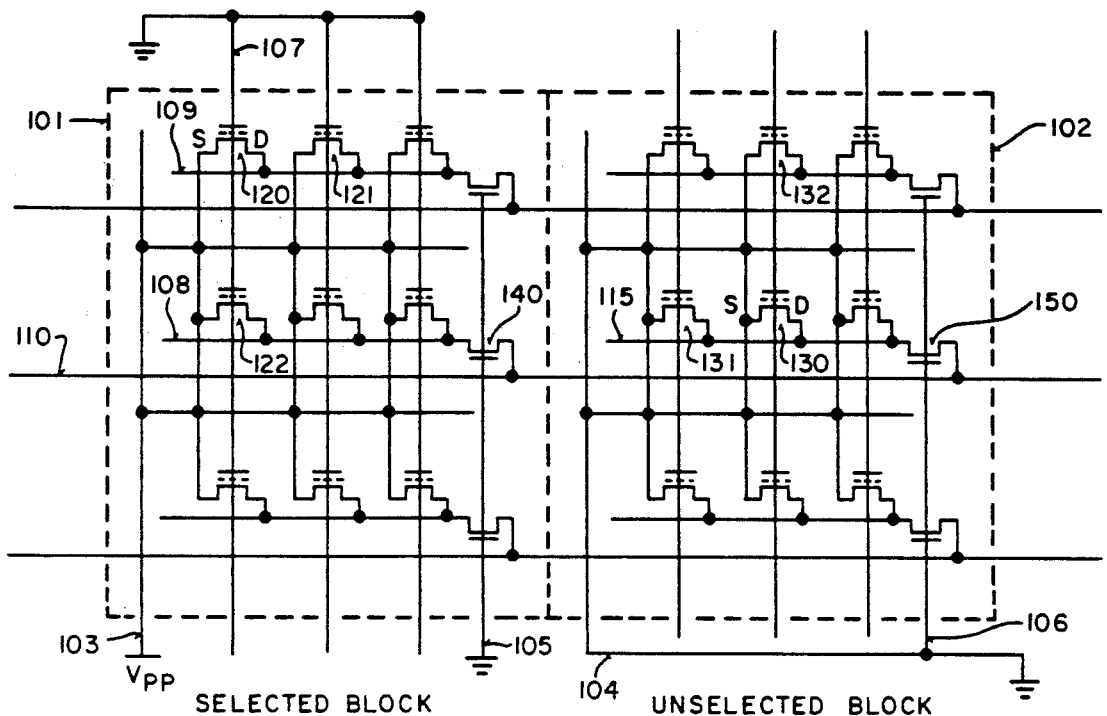
FIG_3A ERASE
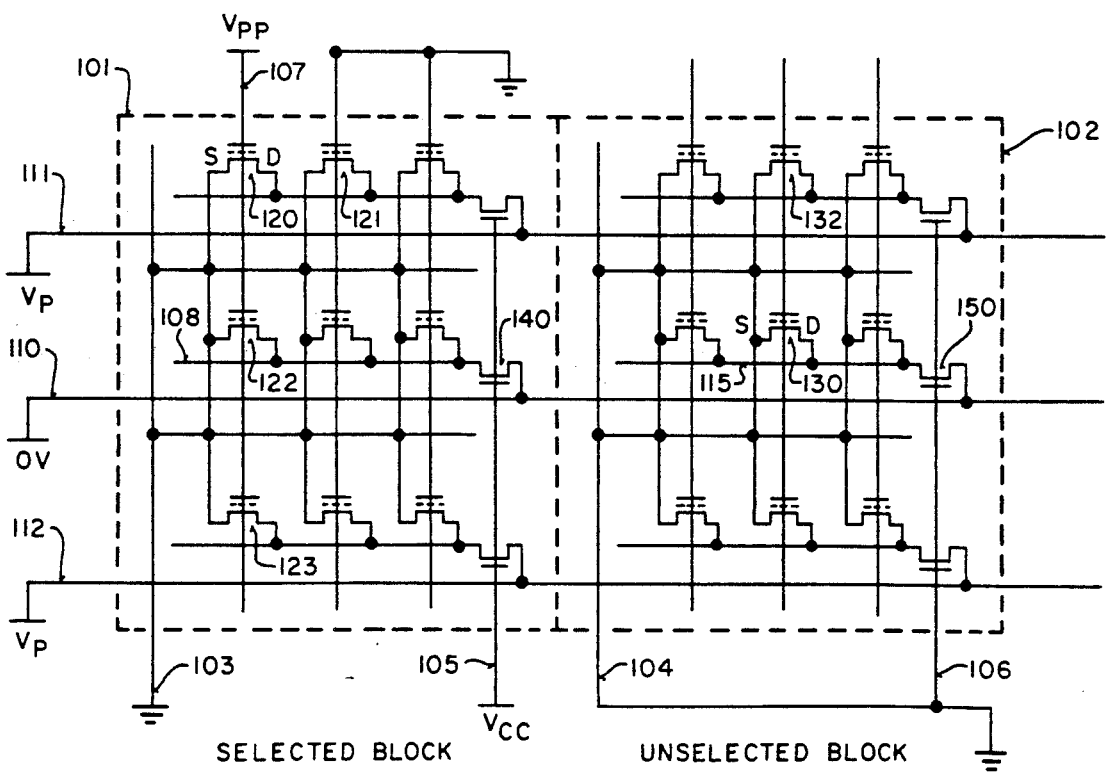
FIG_3B PROGRAM

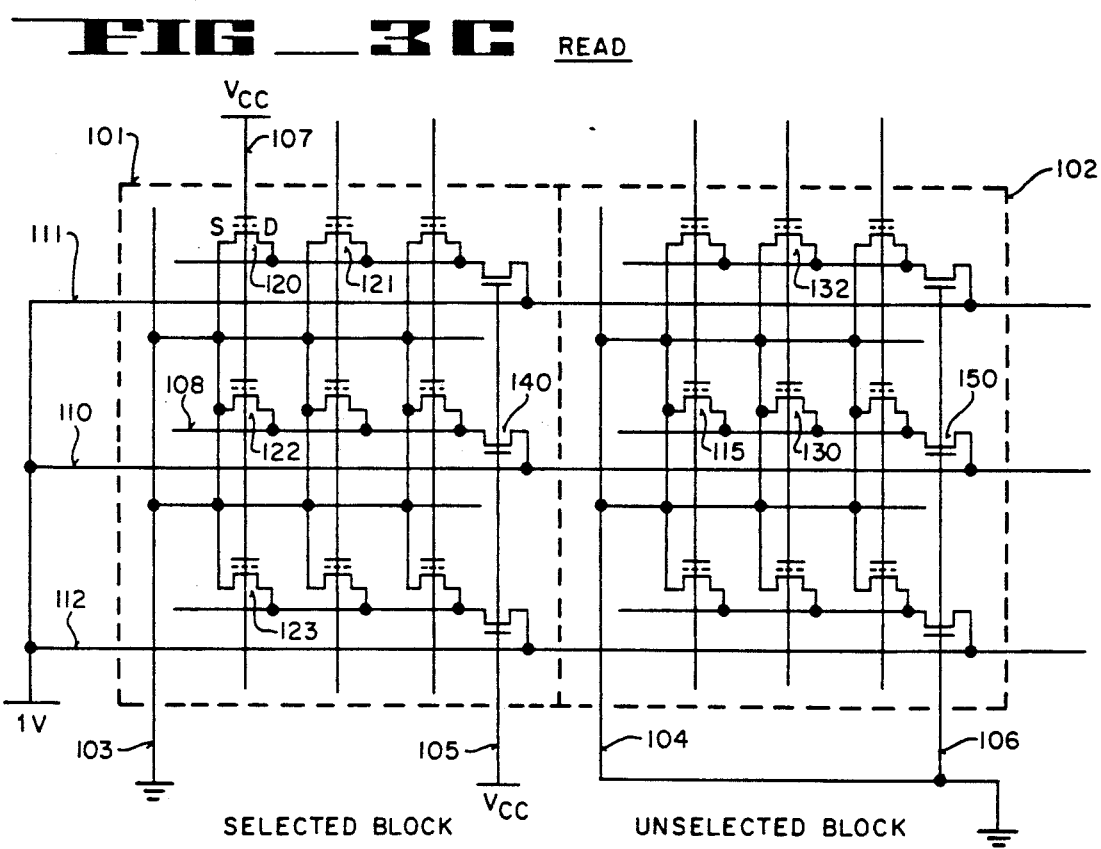
FIG_3C READ
SELECTED BLOCK    UNSELECTED BLOCK

FLOATING GATE NON-VOLATILE MEMORY BLOCKS AND SELECT TRANSISTORS

FIELD OF THE INVENTION

The present invention pertains to the field of non-volatile read-only memories. More particularly, the present invention relates to floating gate memory devices incorporating blocks and select transistors for the blocks.

BACKGROUND OF THE INVENTION

Metal-oxide-semiconductor ("MOS") electrically programmable read-only memories ("EPROMs") frequently use memory cells that have electrically isolated gates (floating gates). Information is stored in the memory cells in the form of charge on the floating gates.

One type of prior EPROM is the flash erasable read-only memory ("flash EPROM"). One such flash EPROM cell is described in copending patent application Ser. No. 253,775, entitled "Low Voltage EEPROM Cell," filed on Oct. 5, 1988.

A typical flash EPROM has the same array configuration as a standard EPROM. The array is thus organized into rows and columns. Memory cells are placed at intersections of word lines and bit lines. Each word line is connected to the gates of a plurality of memory cells in one row. Each bit line is connected to the drains of a plurality of memory cells in one column. The sources of all the memory cells are connected to a common source line. The flash EPROM can be programmed by a user, and once programmed, the flash EPROM retains its data until erased. When programmed, the flash EPROM is programmed byte by byte. Once programmed, the entire contents of the flash EPROM can be erased by electrical erasure in one relatively rapid operation. A high erasing voltage is made available to the sources of all the cells in the flash EPROM simultaneously. This results in a full array erasure. The flash EPROM may then be reprogrammed with new data.

One disadvantage of this prior flash EPROM structure is the characteristics of array erasure. When changes are sought to be made to a program stored in the array, the entire array must be erased and the entire program be rewritten into the array, even when the changes are minor.

One prior approach to solving this problem is to reorganize the array into blocks so that the high erasing voltage is made available only to the source of every cell within one block to be erased. By this arrangement, only a block of the memory array is erased, rather than having the entire memory array erased.

One disadvantage of this prior approach is that interference can arise from the blocked array configuration of the flash EPROM. This interference can be of two types. One type is referred to as drain disturb. Drain disturb arises because the drains of cells within a column are typically interconnected across a block boundary. Another type of interference is referred to as gate disturb. Gate disturb arises because the gates of cells within a column are typically interconnected across a block boundary.

An example of "gate disturb" is as follows. A prior flash EPROM is divided into "bit line blocks" by organizing bit lines into groups. During programming of the flash EPROM, a high voltage $V_{PP}$ (typically 12 volts) is applied to the control gate of a selected cell in a selected block through a selected word line. A program voltage $V_P$ (typically 7 volts) lower than $V_{PP}$ is applied to the drain of the selected cell through a selected bit line. The sources of all the cells within the selected block are grounded during the operation. The gates of unselected cells along unselected word lines both in the selected block and in unselected blocks are grounded. The drains of unselected cells along unselected bit lines both in the selected block and in unselected blocks are either left floating or grounded.

In this situation, the unselected cells on the selected word line will have the high positive voltage $V_{PP}$ (i.e., 12 volts) coupled to their floating gates. An electric field is thus present across each of the unselected cells on the selected word line. The presence of the electric field across each of the unselected cells can cause movement of electrons to the floating gates. This increases the threshold of these unselected cells, causing those unselected cells to be slowly programmed. This is referred to as slow programming. Thus, gate disturb can result in unwanted slow programming.

An example of "drain disturb" is as follows. A prior flash EPROM is divided into "word-line blocks" by organizing word lines into groups. During programming of the flash EPROM, a high voltage $V_{PP}$ of 12 volts is applied to the control gate of a selected cell in a select block through a selected word line. A program voltage $V_P$ of 7 volts is applied to the drain of the selected cell through a selected bit line. The drain of unselected cells on the selected bit line both in the selected block and in an unselected block will be coupled to the voltage $V_P$ of 7 volts. The gates of the unselected cells will be grounded. This creates an electric field across each of the unselected cells on the selected bit line, which causes unwanted movement of electrons from the floating gate to the drain. Thus the threshold of each of the unselected cells is decreased by unwanted movement of electrons, causing those unselected cells to be slowly erased. This is referred to as slow erasing. Thus, drain disturb can result in unwanted slow erasing.

"Gate disturb" and "drain disturb" are especially pernicious because their effects accumulate as either programming or erasing of a selected block of a flash EPROM is repeated. Unwanted movement of electrons in certain unselected cells happens each time there is a program or erase operation.

For gate disturb, the thresholds of unselected cells keep increasing, and the unselected cells are slowly programmed. For drain disturb, the thresholds of unselected cells keep decreasing, and the unselected cells are slowly erased. If the accumulated gate or drain disturbs reach a certain degree on an unselected cell, the state of the unselected cell can be completely altered. In other words, an unselected cell could be unintentionally programmed or erased over time.

SUMMARY AND OBJECTS OF THE INVENTION

One object of the present invention is to provide a non-volatile memory that is organized into blocks and that includes a block erase feature.

Another object of the present invention is to provide a non-volatile memory that is organized into blocks and that includes select transistors for minimizing interference between blocks.

A non-volatile memory device is described. The memory device includes a global bit line, a first block, and a second block. The first block includes a first memory cell having a drain region, a source region, a floating gate and a control gate. A first word line is coupled to the control gate of the first memory cell. A first local bit line is coupled to the drain region of the first memory cell. A first selecting means couples the first local bit line to the global bit line. The second block includes a second memory cell having a drain region, a source region, a floating gate and a control gate. A second word line is coupled to the control gate of the second memory cell. A second local bit line is coupled to the drain region of the second memory cell. A second selecting means couples the second local bit line to the global bit line.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIG. 1 is a cross-sectional view of a floating gate memory cell of a flash EPROM;

FIG. 2 is a block diagram of the layout of the flash EPROM;

FIG. 3a illustrates the array structure of the flash EPROM and potentials applied to a selected block and an unselected block during erasing;

FIG. 3b illustrates potentials applied to a selected block and an unselected block of the flash EPROM during programming;

FIG. 3c illustrates potentials applied to a selected block and an unselected block of the flash EPROM during reading.

DETAILED DESCRIPTION

A flash EPROM of a preferred embodiment of the present invention includes a memory array organized into blocks. The memory array is comprised of memory cells. The memory cells are organized into columns and rows.

The memory array includes word lines, local bit lines, and global bit lines. Select transistors couple the local bit lines to the global bit lines. The flash EPROM of the preferred embodiment further includes a source and block select decoder coupled to the gates of the select transistors for selecting and deselecting blocks of the flash EPROM memory array. This organization of the flash EPROM is described in more detail below.

FIG. 1 shows the prior art memory cell that is included in the flash EPROM of the preferred embodiment of the present invention. The memory cell is formed on a silicon substrate such as the P-type substrate 15 of FIG. 1. The cell of FIG. 1 is shown in a partially fabricated state because this best reveals its structure.

The memory cell includes a pair of spaced-apart doped regions disposed in the substrate—specifically, a drain region 12 and a source region 13. A polysilicon floating gate 10 is generally disposed above and between these regions and insulated from these regions by a layer of silicon dioxide or other insulating layer 14. The floating gate 10 at the completion of the processing is completely surrounded by insulating layers and hence, electrically floats. A second gate (control gate 11) is disposed above the floating gate 10. In the preferred embodiment, this gate is fabricated from a second layer of polysilicon. This control gate is a continuous polysilicon strip that forms a word line for the memory array of FIG. 2.

The memory cell of the preferred embodiment uses asymmetrically doped source and drain regions. The source and drain regions are both doped with an arsenic dopant and the source region is additionally doped with a phosphorous dopant. Hence, the source region is more deeply doped. In addition, the source region overlaps the overlying floating gate. The use of these regions in programming and erasing is discussed in copending U.S. patent application Ser. No. 253,775, filed Oct. 5, 1988.

It will be appreciated that the cell of FIG. 1 may be fabricated using well-known NMOS technology or CMOS technology. The N-channel device illustrated in FIG. 1 may be fabricated directly in a P-type substrate or, when an N-type substrate is used, may be fabricated in a P-type well formed in the substrate. Other variations, such as employing both P-wells and N-wells, are well-known in the art.

The memory cells are programmed (i.e., negatively charging the floating gate) by coupling the word line or control gate 11 to a potential of approximately +12 volts, the drain region to a potential of approximately +7 volts, and the source region to ground. When this happens, channel hot electron injection occurs through the oxide layer 14. The oxide layer is approximately 115 Å thick in the preferred embodiment.

To erase the cell, the drain region is floated, the word line or control gate 11 is grounded, and a potential of approximately +12 volts is applied to the source region. Under these conditions, charge is tunnelled from the floating gate.

To read the cell, a positive potential less than that which would cause charge to transfer onto the floating gate is applied to the control gate (e.g., 5 volts) and a potential (e.g., 1 volt) is applied to the drain region. Current through the device is sensed to determine if the floating gate is or is not negatively charged. As with other floating gate cells, the negative charge on the floating gate shifts the threshold voltage of the cell, making it less conductive. Thus, with a sense amplifier the presence or absence of charge of the floating gate can be determined. This defines if a cell is programmed with a binary one or zero.

The layout of flash EPROM 20 is illustrated in block diagram form in FIG. 2. The memory cells in flash EPROM 20 are organized into blocks. In FIG. 2, BLOCK 1, BLOCK 2, and BLOCK n are intended to illustrate a plurality of blocks. Each block of blocks 1 through n includes a plurality of word lines. In the preferred embodiment, each block includes 128 word lines. In an alternative embodiment, each block may include more or fewer word lines.

Each block of blocks 1 through n of flash EPROM 20 includes a plurality of global bit lines. The global bit lines, unlike the word lines, are shared by and are common to all blocks. The global bit lines are also referred to as common bit lines. The global bit lines are not, however, directly connected to the memory cells in each block.

Each block of blocks 1 through n also includes a number of local bit lines. The local bit lines are only available for the cells within each block. Each local bit line is coupled to a respective global bit line through a select transistor. The local bit lines are generally parallel to the global bit lines. The generally parallel global and local bit lines are perpendicular to the generally parallel word lines.

The global bit lines are formed by an upper or second continuous metal layer that extends through all blocks of the entire array of flash EPROM 20. The local bit lines in each block of blocks 1 through n are formed by a lower or first metal layer below the second metal layer on flash EPROM 20. For example, global bit line 37 is formed by the second metal layer and local bit line 38 is formed by the first metal layer. Each local bit line in each block is connected to its respective global bit line via a select transistor.

Each block of flash EPROM 20 includes a plurality of such select transistors. In one embodiment, these select transistors may be ordinarily-fabricated field-effect transistors ("FETs"). In one embodiment, these select transistors are N-channel FETs. In an alternative embodiment, these select transistors are P-channel FETs.

Each select transistor in each block couples a global bit line to a respective local bit line. The local bit line that is connected to the drain terminals of a set of cells within the block. The drain of each select transistor is connected to a global bit line and the source to the local bit line. The gates of all select transistors in one block are connected to a block select line. Each block select line for each block applies either an ON potential or an OFF potential to the gates of all select transistors in each block. Being switched on or off, all select transistors in one block couple or decouple the local bit lines in the block to their respective global bit lines. For example, block select line 23 is coupled to BLOCK 1, block select line 25 is coupled to BLOCK 2, and block select line 27 is coupled to BLOCK n. Select transistor 36 of BLOCK 1 has its drain region connected to global bit line 37, and its source region connected to local bit line 38. The gate of select transistor 36 is coupled to block select line 23. Select transistor 36 is controlled by its gate potential to be switched on or off. Being switched on or off, select transistor 36 couples or decouples local bit line 38 to its global bit line 37.

The memory cells of each block are formed at intersections of word lines and local bit lines. The memory cells within each block have their drain regions coupled to the local bit lines. The control gates of the memory cells in each block are connected to the block word lines. The control gates are formed from continuous strips of polysilicon. The strips extend within a block to form the word lines for that block. The source regions for all the cells in each of the blocks are connected together to a common source line. For example, cell 28 in BLOCK 1 has its drain region coupled to local bit line 38, its control gate coupled to word line 40, and its source region 39 coupled to common source line 22. The source regions for all the cells in each individual block are connected together by a diffusion layer.

In an alternative embodiment, a flash EPROM Includes global word lines, local word lines, and also bit lines. The flash EPROM is organized into blocks, and each block includes a plurality of generally parallel bit lines and a plurality of generally parallel local work lines. The local word lines are only coupled to the gates of the cells within each block. Each local word line is coupled to a respective one of a plurality of global word lines through a select transistor. The global word lines extend throughout all the blocks of that flash EPROM.

Referring again to the preferred embodiment of FIG. 2, each block of flash EPROM 20 has its common source line connected to the source regions of all cells within the block. The common source line for each of the blocks is formed by the first metal layer beneath the second metal layer. The common source line is connected to the source regions of all the cells within one block via the diffusion layer. For example, BLOCK 1 has common source line 22 coupled to the source regions of all cells within the block, BLOCK 2 has common source line 24 coupled to the source regions of all cells with the block and BLOCK n has common source line 20 coupled to the source regions of all cells within the block.

Flash EPROM 20 has X decoder 44 and Y decoder 43. X decoder 44 is coupled to each block of blocks 1 through n through a number of word lines respectively. X decoder 44 receives X addresses from X address lines $A_{XO}$ to $A_{XM}$. X decoder 44 then selects a block by selecting a word line within that block to undergo read, program or erase operation. For any given X address, only one block is a selected block in flash EPROM 20. X decoder 44 applies a read or program potential to the gates of selected cells through the selected word line within the selected block.

In the currently preferred embodiment, one word line is constructed to extend only within one block and is not connected to the gate of any cell in its adjacent blocks. Given that a potential applied to one word line within one block can not be coupled to any cell in its adjacent blocks, no gate disturb to the adjacent blocks occurs. When a selected word line in a selected block is applied with a potential only the gates of the cells on the selected word line are coupled to that potential, therefore eliminating the possibility of any gate disturb to cells in the unselected blocks. X decoder 44 may be any ordinary decoder available.

Y decoder 43 is coupled to the global bit lines that extend through all blocks of flash EPROM 20. Y decoder 43 receives its Y addresses through Y address line $A_{YO}$ to $A_{YM}$. Y decoder 43 is also coupled to sense amplifier and output buffers 41 via output bus 8. In one of read and program operation, Y decoder 43 selects one byte of global bit lines (i.e., 8 lines) in flash EPROM 20 for each of the Y addresses applied. Y decoder 43 also couples the 8 selected global bit lines to sense amplifier and output buffers 41. Although Y decoder 43 allows the selection of one byte of global bit lines for each Y address applied, it is appreciated that any other number of global bit lines can be selected by Y decoder 43 for any Y address applied. For example, Y decoder 43 can select two bytes of 16 global bit lines for any given Y address. Y decoder 43 may be any ordinary decoder.

Y decoder 43 couples a read or program potential to the selected global bit lines. Given the fact that each global bit line is coupled to its respective local bit line in each block through a select transistor, the potential on the selected global bit lines can be controlled to apply only to the drains of the selected cells in a selected block. The local bit lines in unselected blocks can be controlled by the select transistors in these unselected blocks to decouple from the selected global bit lines. In this way, drain disturb can be avoided to cells in the unselected blocks.

Flash EPROM 20 also includes source and block select decoder 21. Source and block select decoder 21 has two lines coupled to each block of blocks 1 through n. One line is the common source line and the other is the block select line. The common source line is connect to the source regions of all cells in the block, the block select line is connected to the gates of all select transistors in the same block.

Source and block select decoder 21 receives X addresses from X address lines $A_{X0}$ to $A_{XM}$ to select a block by selecting the common source line and block select line associated with the selected block. Again, for any given X address, only one block is a selected block. Given that each block of blocks 1 through n has only two independent lines coupled to source and block select decoder 21, only a subset of the X addresses is required by source and block select decoder 21 to determine which block has been selected and conversely which blocks are not selected. Thus, source and block select decoder 21 may be an intermediate decoding stage of X decoder 44 used for selecting the word lines from the blocks. It can also be true that source and block select decoder 21 is a separate decoder.

When selecting a block, source and block select decoder 21 couples an ON potential to the block select line for the selected block. Meanwhile, source and block select decoder 21 maintains all other block select lines for the unselected blocks in flash EPROM 20 at OFF potential. As described above, the OFF potential applied to the block select lines for the unselected blocks will keep these unselected blocks decoupled from the selected block during one of the operations.

With such array configuration, flash EPROM 20 is able to prevent disturbs from cells in one selected block in each of read, program and erase operation to cells in all other unselected blocks. This function of flash EPROM 20 to prevent the memory state of cells in the unselected blocks from being disturbed by the cells in the selected block will be described in more detail below, in connection with the description of each of the read, program, and erase operations.

Initially, the entire flash EPROM 20 of FIG. 2 is erased before being programmed. After initial programming, it is expected that one or more blocks will be selected for reprogramming. In this case, only the block or blocks requiring reprogramming are erased and reprogrammed.

Now assume that BLOCK 1 of flash EPROM 20 of FIG. 2 is to be programmed with a new program. Before this can occur, BLOCK 1 needs to be erased first. To perform the erase operation, an X address containing the information that BLOCK 1 is to be erased is applied through X address lines $A_{X0}$ through $A_{XM}$ to source and block select decoder 21. Source and block select decoder 21 applies a high erasing potential $V_{PP}$ to common source line 22 and an OFF potential to block select line 23. In the currently preferred embodiment, the OFF potential is ground and the $V_{PP}$ potential is +12 volts. The OFF potential then turns off every select transistor in BLOCK 1, decoupling all the global bit lines to all the local bit lines in BLOCK 1. The $V_{PP}$ potential then is applied to the source region of every cell within BLOCK 1 and the ground potential is applied to the gates of all the select transistors within the block. The drains of all cells in BLOCK 1 are thus allowed to float during this erase operation. Meanwhile, X decoder 44 couples all the word lines of BLOCK 1 to ground potential. In this manner, all the cells in BLOCK 1 that require reprogramming are erased.

During this erasing operation, source and block decoder 21 maintains the common source lines and block select lines of unselected blocks both at ground potential. For example, block select lines 25 and 27 for BLOCK 2 and BLOCK n are coupled to ground potential, turning all select transistors in these unselected blocks off. This in turn decouples all local bit lines in BLOCK 2 and BLOCK n from the global bit lines extending through the unselected blocks. Given the fact that the local bit lines of blocks 2 through n are decoupled from the global bit lines and common source line 22 is connected only to the sources of all the cells within BLOCK 1, no disturb to cells in the unselected blocks occurs during the erase operation.

Once erasing has occurred, the cells in BLOCK 1 may be reprogrammed, one byte at a time. For programming under these circumstances, an X address containing the information of which byte within BLOCK 1 to be programmed is coupled to X decoder 44 and source and block select decoder 21 through X address lines $A_{X0}$ to $A_{XM}$. X decoder 44 sequentially select one word line at a time for programming by coupling that word line to a potential of +12 volts. Source and block select decoder 21 applies a ground potential to common source line 22 which in turn is coupled to the source regions of all the cells in BLOCK 1. The ON potential of $V_{CC}$ is also coupled from source and block select decoder 21 to block select line 23. In the currently preferred embodiment, the Vcc potential is +5 volts or a higher voltage. This $V_{CC}$ potential is then applied to the gate of every select transistor in BLOCK 1 via block select line 23. The $V_{CC}$ potential then turns on all select transistors in BLOCK 1. One Y address at a time is applied to Y decoder 43 through Y address lines $A_{Y0}$ to $A_{YM}$. With the Y address applied, Y decoder 43 selects a byte of global bit lines and applies a program potential $V_p$ to the selected global bit lines. In the currently preferred embodiment, the $V_p$ potential is +7 volts.

Meanwhile, source and block select decoder 21 maintains the common source lines and block select lines for the unselected blocks of blocks 2 through n all at ground potential. All other unselected global bit lines remain at ground potential. The input Y address determines which of the global bit lines are coupled to $V_p$ potential for programming.

Given the fact that block select line 23 is coupled to the $V_{CC}$ potential by source and block select decoder 21, each select transistor in BLOCK 1 is turned on to coupled each local bit line to its respective global bit line. For example, select transistor 36 is turned on by the $V_{CC}$ potential at block select line 23 and line 35 to couple global bit line 37 to local bit line 38. All other select transistors in unselected blocks of blocks 2 through n however, maintain their off condition with ground potential applied at their block select lines 25 and 27. This decouples all local bit lines in the unselected blocks of blocks 2 through n to the global bit lines.

In this way, only the selected cells in BLOCK 1 then have their drains coupled to the $V_p$ potential. Because all local bit lines in the unselected blocks of blocks 2 through n are decoupled from the global bit lines, the drains of all other cells in unselected block of blocks 2 through n are not coupled to this $V_p$ potential by their local bit lines. Given that no $V_{PP}$ potential or $V_p$ potential is applied to either the gate or drain of any cell in the unselected blocks of blocks 2 through n, the cells in the unselected block of blocks 2 through n do not experience either a gate disturb or drain disturb during the programming operation.

Once the selected cells in BLOCK 1 are programmed, data can be read from them. During the reading of data, an X address applied to source and block select decoder 21 selects BLOCK 1. Source and block select decoder 21 couples common source line 22 to ground potential. A word line in BLOCK 1 is selected by the X address through X decoder 44. A read voltage of approximately 5 volts is maintained on the selected word line. A Y address applied to Y decoder 43 selects one or a number of global bit lines and Y decoder 43 couples these global bit lines to a potential of approximately one volts. Given the fact that all the local bit lines in BLOCK 1 are coupled to all the global bit lines, the drains of the selected cells in BLOCK 1 are coupled to the one volt potential through their respective local bit lines. The data store in the selected cells are then read out by sense amplifier and output buffers 41 via output bus 8. Whether a selected cell store a one or zero bit information is determination by the conductivity of the cell using ordinary sense amplifiers. For example, if cell 28 in BLOCK 1 is selected for reading its gate is couple to a 5 volt potential by word line 40, its source is couple to ground potential via source line 39. Given that select transistor 35 couples local bit line 38 to global bit line 37, the drain of cell 28 is coupled to the one volt potential. The stored information is then read by sense amplifier and output buffers 41.

Meanwhile, source and block select decoder 21 maintains block select lines 25 and 27 of the unselected blocks of blocks 2 through n all at the ground potential, decoupling all local bit lines in these blocks from the global bit lines. Thus, no disturb occurs to any cell in the unselected blocks of blocks 2 through n during the read operation of BLOCK 1. The reference cells used in the currently preferred embodiment are discussed in the above-mentioned patent application.

FIGS. 3a-3c schematically illustrate the array configuration of flash EPROM 20 of FIG. 2. FIGS. 3a-3c also show the potentials applied to a selected block and an unselected block during an erase, program or read operation of flash EPROM 20 of FIG. 2, respectively.

In FIG. 3a-3c, both the select block and the unselect block is shown with nine memory cells. In practice, many more blocks, each having many more memory cells, are used. The specific number of blocks, the specific number of cells per block, the specific number of local bit lines per block and the specific number of word lines per block are not critical in the currently preferred embodiment.

Referring to FIG. 3a, block 101 represents a selected block and includes memory cells such as cell 120. Block 102 represents an unselected block and includes memory cells such as cell 130. Each cell in both the selected block and unselected block has its drain coupled to a local bit line, its gate to a word line and its source to a common source line. For example, the drain of cell 120 is coupled to local bit line 109, the gate of cell 120 is coupled to word line 107 and the source of cell 120 is coupled to common source line 103. Memory cells in each of selected block and unselected block are either gate-connected or drain-connected with other memory cells within each block. The sources of all cells in one block are coupled to a common source line. For example, cell 120 is drain-connected with cell 121 and gate connected with cell 122. Common source line 103 for block 101 has all source regions coupled to it. Similarly, cell 130 is drain-connected with cell 131 and gate-connected with cell 132.

Both selected block 101 and unselected block 102 share a number of global bit lines. Each of the global bit lines is coupled to a local bit line through a select transistor in each block. The gates of all select transistors in one block is coupled to a block select line. A potential applied to the block select line determines the ON or OFF state of all select transistors within one block, thus coupling or decoupling all local bit lines in one block to the global bit lines. For example, local bit line 108 in block 101 is coupled to global bit line 110 via select transistor 140. Local bit line 115 in block 102 is coupled to global bit line 110 via select transistor 150. The gate of select transistor 140 is coupled to block select line 105. Select transistor 140 is either turned on or off by a potential applied to block select line 105. Similarly, select transistor 150 has its gate coupled to block select line 106. The potential applied to block select line 106 either turns on or off select transistor 150. In this way, the drains of all cells in one block are controlled to be coupled or decoupled to potentials applied on the global bit lines.

In FIG. 3a, the source regions of the cells in block 101 are connected to the program potential $V_{PP}$ through line 103 during erasing. The source regions of the cells in block 102 are coupled to ground potential through common source line 104. For erasing, all the control gates of the cells in block 101 are coupled to ground potential. All the drain regions of the cells in block 101 are left floating. Thus, word line 107 and other word lines in block 101 are coupled to ground potential. Local bit line 108 and other local bit lines in block 101 are decoupled to global bit line 110 and other global bit lines by applying the ground potential on block select line 105. For these conditions, any negative charge on the floating gates of the cells in selected block 101 is removed through the source regions thus erasing the floating gates leaving them neutrally charged.

Meanwhile, common source line 104 and block select line 106 for unselected block 102 are coupled to ground potential, making it impossible for any potential to be coupled to any cell in unselected block 102 during the erase operation. Under these conditions, all the cells in a single selected block can be erased and the memory cells in unselected blocks remain undisturbed, and thus unchanged.

FIG. 3b illustrates the potentials applied to block 101 and 102 shown in FIG. 3a during programming of the cells in block 101. During programming, all source regions of the cells in selected block 101 are coupled to ground potential via common source line 103. All select transistors in block 101, including select transistor 140 are turned on by the $V_{CC}$ potential applied to their gates via at the block select line 105, thus coupling all the local bit lines of block 101 to the global bit lines. For example, local bit line 108 is coupled to global bit line 110 through turned-on select transistor 140.

Assume that X decoder 44 shown in FIG. 2 has selected word line 107 for programming and that cells along this word line 107 in block 101 are to be programmed. X decoder 44 then couples the program potential $V_{PP}$ to word line 107. If, for example, memory cells 120 and 123 are to be programmed (e.g., its floating gate is to be negatively charged), the drain regions of cells 120 and 123 are coupled to another program potential $V_P$ while selected word line 107 is held at $V_{PP}$ potential of +12 volts. In the currently preferred embodiment, the $V_P$ potential is +7 volts. The drain of cell 122 which is not to be programmed, is coupled to ground potential of zero volts. The $V_P$ potential and ground potential are applied to global bit lines 111, 110, and 112 respectively. Given that all the local bit lines in block 107 are all coupled to the global bit lines, the $V_P$ potential and ground potential on global bit lines 111, 110, and 112 can therefore be coupled to the drains of cells 120, 122, and 123. Under these conditions charge is transferred from the substrate to the floating gate in cell 120 and 123.

Since other word lines in block 101 have not been selected by the X address for programming, they are held at ground potential, and none of the other cells along these unselected words lines are programmed.

Meanwhile, the ground potential is applied on block select line 106 that switches off all select transistors, including select transistor 150, in the unselected block 102. Hence, all local bit lines in block 102, including local bit line 115 are decoupled to global bit lines 111, 110, 112, making unselected block 102 completely isolated from the potentials applied to selected block 101.

Nonetheless, unselected cells in selected block 101, such as cell 121 and 122, do undergo drain or gate disturb during programming. The disturbs, however, will not alter the memory state of any cell within the selected block because the entire block needs to be erased before reprogramming to any cell within this block can occur.

FIG. 3c illustrates the potentials applied to block 101 and 102 shown in FIG. 3a during reading of cells in block 101. During reading of the data, all source regions of the cells both in selected block 101 and unselected block 102 are coupled to ground potential via common source lines 103 and 104 respectively. All select transistors in block 101 are switched on by the $V_{CC}$ potential applied at block select line 105, thus coupling all the local bit lines in block 101, including local bit line 108 to their respective global bit lines 111, 110, and 112. All the select transistors in unselected block 102 are switched off by ground potential applied on block select line 106. This decouples all the local bit lines of block 102, including local bit line 115 to their respective global bit lines.

Assume that word line 107 is selected for reading. The $V_{CC}$ potential is thus maintained on word line 107. If, for example, cell 120, 122 and 123 along word line 107 are to be read, a one volt potential is then coupled through global bit lines 111, 110 and 112 to the drains of cells 120, 122 and 123. Whether a cell stores logical zero or logical one bit information can then be determines by the conductivity of the cell using ordinary sense amplifiers.

In the foregoing specification the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A non-volatile memory device comprising:
    (A) a global bit line;
    (B) a first block comprising
        (1) a first memory cell having a drain region, a source region, a floating gate, and a control gate;
        (2) a first word line coupled to the control gate of the first memory cell;
        (3) a first local bit line coupled to the drain region of the first memory cell;
        (4) a first transistor for coupling the first local bit line to the global bit line, wherein the first transistor has a drain coupled to the global bit line and a source coupled to the first local bit line, wherein the gate of the transistor is selectable between an off potential and an on potential; and
    (C) a second block comprising
        (1) a second memory cell having a drain region, a source region, a floating gate, and a control gate;
        (2) a second word line coupled to the control gate of the second memory cell;
        (3) a second local bit line coupled to the drain region of the second memory cell;
        (4) a second transistor for coupling the second local bit line to the global bit line, wherein the second transistor has a drain coupled to the global bit line and a source coupled to the second local bit line, wherein the gate of the second transistor is selectable between an off potential and an on potential.

2. The memory device of claim 1, further comprising a block select decoder coupled to the gate of the first and second transistors for selecting a selected block of the first and second block by applying the on potential to the gate of one of the first and second transistors of the selected block.

3. The memory device of claim 1, wherein the on potential is above +5 volts and the off potential is ground.

4. The memory device of claim 1, wherein the first transistor is N-channel field-effect transistor and the second transistor is N-channel field-effect transistor.

5. The memory device of claim 1, wherein the source region for the first memory cell is connected through a diffusion layer to a first common source line that is formed by a first metal layer connected to the diffusion layer, wherein the source region for the second memory cell is connected through a diffusion layer to a second common source line that is formed by a first metal layer connected to the diffusion layer, wherein both the first and the second common source line is coupled to a source and block select decoder.

6. A non-volatile memory device comprising:
    (A) a global word line;
    (B) a first block comprising
        (1) a first memory cell having a drain region, a source region, a floating gate and a control gate;
        (2) a first local word line coupled to the control gate of the first memory cell;
        (3) a first bit line coupled to the drain region of the first memory cell;
        (4) a first transistor for coupling the first local word line to the global word line, wherein the first transistor has a drain coupled to the global word line and a source coupled to the first local word line, wherein the gate of the transistor is selectable between an off potential and an on potential; and
    (C) a second block comprising
        (1) a second memory cell having a drain region, a source region, a floating gate and a control gate;
        (2) a second local word line coupled to the control gate of the second memory cell;

(3) a second bit line coupled to the drain region of the second memory cell;

(4) a second transistor for coupling the second local word line to the global word line, wherein the second transistor has a drain coupled to the global word line and a source coupled to the second local word line, wherein the gate of the second transistor is selectable between an off potential and an on potential.

7. The memory device of claim 6, further comprising a block select decoder coupled to the gate of the first and second transistors for selecting a selected block of the first and second block by applying the on potential to the gate of one of the first and second transistors of the selected block.

8. The memory device of claim 6, wherein the on potential is above +5 volts and the off potential is ground.

9. The memory device of claim 6, wherein the first transistor is N-channel field-effect transistor and the second transistor is N-channel field-effect transistor.

10. The memory device of claim 6, wherein the source region for the first memory cell is connected through a diffusion layer to a first common source line that is formed by a first metal layer connected to the diffusion layer, wherein the source region for the second memory cell is connected through a diffusion layer to a second common source line that is formed by a first metal layer connected to the diffusion layer, wherein both the first and the second common source line is coupled to a source and block select decoder.

* * * * *